United States Patent [19]

Diepers

[11] 4,072,588
[45] Feb. 7, 1978

[54] METHOD FOR THE ANODIC POLISHING OF SURFACES OF INTERMETALLIC NIOBIUM COMPOUNDS AND NIOBIUM ALLOYS

[75] Inventor: Heinrich Diepers, Erlangen, Germany

[73] Assignee: Siemens Aktiengesellschaft, Munich, Germany

[21] Appl. No.: 768,829

[22] Filed: Feb. 15, 1977

[30] Foreign Application Priority Data

Mar. 8, 1976 Germany .............................. 2609549

[51] Int. Cl.² ............................ C25F 3/26; C25F 7/00
[52] U.S. Cl. ............................... 204/129.43; 204/129.1; 204/129.8; 204/228; 204/231; 204/DIG. 7
[58] Field of Search ............... 204/129.1, 129.2, 129.8, 204/228, 231, DIG. 7, 129.43

[56] References Cited

U.S. PATENT DOCUMENTS

| 2,044,431 | 6/1936 | Harrison | 204/231 X |
| 3,627,648 | 12/1971 | Waggener | 204/27 |
| 3,689,388 | 9/1972 | Diepers et al. | 204/129.43 |

Primary Examiner—F.C. Edmundson
Attorney, Agent, or Firm—Kenyon & Kenyon, Reilly, Carr & Chapin

[57] ABSTRACT

The surface of an intermetallic niobium compound or niobium alloy to be polished is electrically shunted across a niobium part and immersed in electrolyte together with the latter permitting relatively thick surface layers of niobium compounds of high quality which are used for superconducting a-c apparatus to be produced.

4 Claims, 1 Drawing Figure

U.S. Patent  Feb. 7, 1978  4,072,588
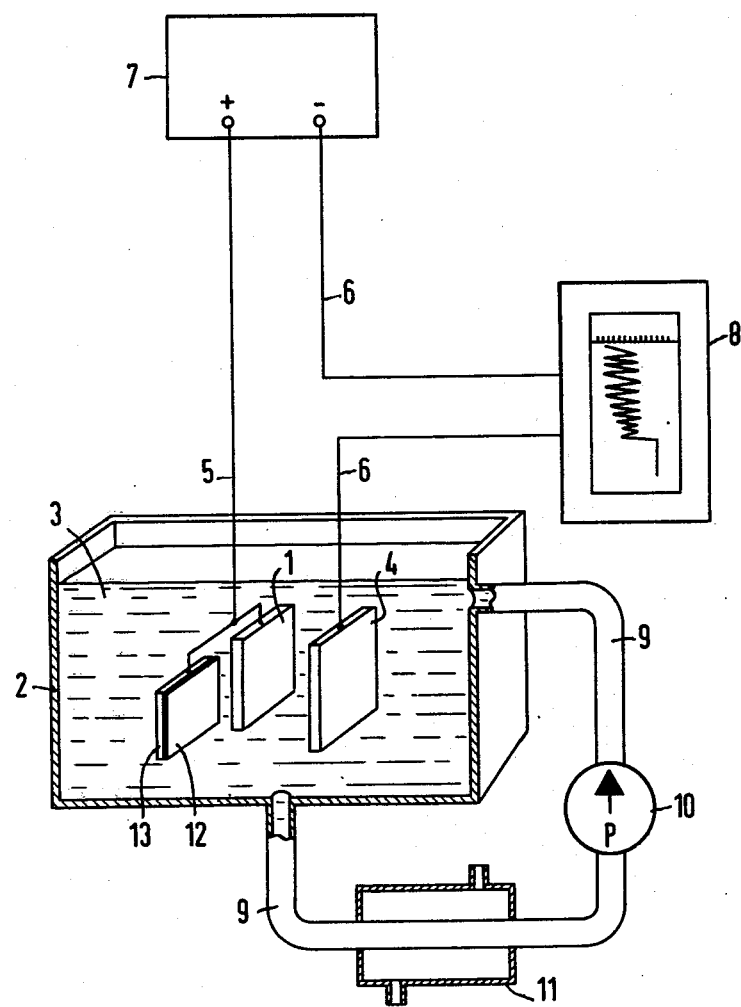

METHOD FOR THE ANODIC POLISHING OF SURFACES OF INTERMETALLIC NIOBIUM COMPOUNDS AND NIOBIUM ALLOYS

BACKGROUND OF THE INVENTION

This invention relates to the anodic polishing of surfaces of intermetallic niobium compounds and niobium alloys, in general and more particularly to an improved method for such polishing.

For various applications, particularly a-c applications, of superconductors which either consist entirely or at least have a surface layer of an intermetallic niobium compound, e.g., $Nb_3Sn$, or of a niobium alloy such as, for instance, niobium with 25 atom -% zirconium or niobium-titanium alloys with about 25 to 60% by weight titanium, it is of interest to have surfaces which are as smooth as possible and which are free of impurities and disturbances. In superconducting cavity resonators of niobium which are provided with an $Nb_3Sn$ layer at their inside surface which is exposed to a high frequency field, for instance, a smooth surface, free of disturbances, for this $Nb_3Sn$ layer is a condition for attaining a high critical flux density and a high Q factor. For, the alternating electromagnetic high frequency fields penetrate only some $10^{-8}m$ deep into the superconductor surface. The same is true for the depth of penetration of a-c currents in other a-c applications of $Nb_3Sn$. An example of such an application is use in superconductor cables, where $Nb_3Sn$ can have advantages because of its critical current density which is substantially higher than that of niobium. Because of this small depth of penetration, the physical condition of the $Nb_3Sn$ surface is of decisive importance for its application as an a-c superconductor. In particular, a surface which is disturbed, for instance, by roughness or impurities, can lead to an increase in the surface resistance and thus to increased a-c losses in the surface. High losses, however, result in an undesirable development of heat and, in the case of superconducting resonators, in particular, in a decrease of the Q factor and a reduction of the cirtical flux density.

Mechanical polishing methods are not well suited for achieving the desired smooth and disturbance-free surfaces. The same is true of chemical polishing methods, which lead to etching of the surface.

A method suited for treating superconductive $Nb_3Sn$ surfaces, particularly for removing impurities from such surfaces, is, in fact, the method described in the journal "IEEE Transactions on Magnetics", vol. MAG-11, No. 2, March 1975, pages 420–422. In the disclosed method an oxide layer is generated on the $Nb_3Sn$ surface by anodic oxidation of an aqueous ammonia solution. The layer is subsequently dissolved again chemically by means of hydrofluoric acid. However, since in this method the oxide layer formed is only fractions of a micrometer thick, a surface layer also only a fraction of a micrometer thick is removed when the oxide layer is dissolved. To remove surface layers 1 micrometer or more thick, the anodic oxidizing and the subsequent dissolving of the oxide layer would therefore have to be repeated many times. This is very expensive and time consuming, in particular because of the continuous changing between the ammonia solution and the hydrofluoric acid which is required. In addition, peaks or corners protruding from the surface can also be removed only by oxidizing and chemically dissolving the oxide layers many times. Because of the field concentration at such a peak, it is preferred that the oxide layer be formed there first. However, as soon as the latter has reached a given thickness, the growth of the thickness at the peak comes to a standstill until the oxide layer on the rest of the surface has reached a corresponding thickness. The surface remaining after the oxide layer is dissolved is therefore still a relatively accurate facsimile of the original surface, at least after only a few repetitions of oxidizing and dissolving.

SUMMARY OF THE INVENTION

It is an object of the present invention to provide a method for the anodic polishing of surfaces of intermetallic niobium compounds and niobium alloys which yields very smooth surfaces and permits rapid removal of layers with a layer thickness of 1 micrometer or more.

In the anodic polishing of niobium parts, as opposed to parts of niobium compounds or alloys, these requirements are met by the method described in U.S. Pat. No. 3,689,388 in which a niobium part acting as an anode is placed, together with a cathode, in an electrolyte of 86 to 93% by weight $H_2SO_4$, 1.5 to 4.0% by weight HF and 5.5 to 10.0% by weight $H_2O$ with a temperature of between 15° and 50° C. A constant voltage between 9 and 15 V is adjusted in such a manner that damped current oscillations which are superimposed on the electrolyte current occur and, at the latest, after the current oscillations have decayed completely, the voltage is disconnected until the oxide layer built up during the current oscillations is dissolved; subsequently a constant voltage between 9 and 15 V is again adjusted in such a manner that damped current oscillations occur; and this sequence of voltage application and removal is repeated a number of times.

Surprisingly, it has now been found that this known method can be used for the anodic polishing of surfaces of intermetallic niobium compounds and niobium alloys if, in accordance with the present invention, the surface of the intermetallic compound of the niobium alloy to be polished is electrically shunted across the niobium part.

In this procedure the current oscillations occurring between the niobium part and the cathode are superimposed on the current flowing between the cathode and the surface of the niobium compound or the niobium alloy to be polished and lead to a polishing effect at this surface which is practically as good as that at the surface of the niobium part.

A particularly strong superimposition of the current oscillations between the niobium part and the cathode onto the surface to be polished is obtained when a niobium part having a surface facing the cathode which is at least as large as the surface of the intermetallic niobium compound or the niobium alloy is used.

The method according to the present invention is particularly advantageous for the anodic polishing of $Nb_3Sn$ surfaces; but is also well suited for polishing, for instance, surfaces of other intermetallic niobium compounds with an A-15 crystal structure such as $Nb_3Ge$, or for polishing the surfaces of the niobium alloys mentioned above.

As in the method described in U.S. Pat. No. 3,689,388 for the anodic polishing of niobium parts, deviations of about ±0.1 V from the respectively adjusted voltage are permissible. With larger deviations, oscillations with sufficient amplitude no longer occur. Switching the voltage off permits the oxide layer, which is built up during the current oscillations, and which leads to the decay of the oscillations, to be dissolved. With the dissolution, current oscillations are made possible once more when the voltage is switched on again. By repeating the periods with the voltage on and off several times, mirror smooth surfaces are obtained in a short time. By repeating these periods many times, relatively thick layers can also be removed without undue etching of the surface.

The most favorable voltage for bringing about the current oscillations depends to some extent on the composition and the temperature of the electrolyte and can be determined experimentally simply by raising the voltage until the desired oscillations set in. As with the anodic polishing of niobium parts, it is particularly advantageous to work with an electrolyte consisting of 89.0 to 90.5% by weight $H_2SO_4$, 2.2 to 3.0% by weight HF and the remaining weight $H_2O$ with a temperature of 20° to 35° C and constant voltages between 11 and 13 V. Under these conditions, particularly fast current oscillations which yield a particularly good polishing effect will occur.

It is not necessary to wait until the current oscillations have decayed completely before switching off the voltage. In order to utilize the polishing action occurring during the current oscillations well the voltage should not be disconnected, however, before the maximum amplitude of the current oscillations has been passed. In an individual case, the earliest time for switching the voltage on again can likewise be easily determined experimentally. For, as long as an oxide layer is still present, no new current oscillations can occur when the voltage is switched on. In order to ensure complete dissolution of the oxide layer built up during the current oscillations, the voltage should preferably remain switched off each time for at least 4 minutes, with the electrolyte stationary. The dissolution of the oxide layer can be accelerated if the electrolyte is kept in motion during the time the voltage is switched off. In that case, the voltage should preferably be switched off each time for at least 1.5 minutes.

BRIEF DESCRIPTION OF THE DRAWING

The single FIGURE is a schematic illustration of apparatus for carrying out the method of the present invention.

DETAILED DESCRIPTION OF THE INVENTION

The FIGURE is a schematic illustration of an apparatus for carrying out the method according to the present invention. In this apparatus, the niobium part 1 is arranged in a tank 2 which contains an electrolyte 3. In the tank 2, there is also a cathode 4, which will preferably consist of platinum or pure aluminum. Aluminum is also suited as the material for the tank 2, since it is coated with a passivating layer. The niobium part 1 and the cathode 4 are connected to the outputs of a power supply unit 7 with leads 5 and 6, which, for instance, may also consist of aluminum. The power supply 7 permits adjusting and maintaining constand a d-c voltage between the niobium part 1 and the cathode 4. An instrument 8, e.g., a chart recorder, for recording the current is inserted into the lead 6 to the cathode 8. Using the recordings of chart recorder 8, the current oscillations and the maintenance of the parameters of the method are monitored. A pump 10 inserted into a pipeline 9 permits the electrolyte 3 to be circulated in the tank 2 during the phases when the voltage is switched off. The pipeline 9 is advantageously brought through a heat exchanger 11, in which the electrolyte, which was warmed up by the passage of the current, can be cooled, for instance, using water. The $Nb_3Sn$ surface 12 which is to anodically be polished and which is on a carrier 13 made, for instance, of niobium or another suitable metal, is shunted electrically across the niobium part 1 and, together with the latter, is arranged opposite the cathode 4. The surface of the niobium part 1 facing the cathode 4 is somewhat larger than the $Nb_3Sn$ surface 12 to be polished.

EXAMPLE

The following example of the method according to the present invention was carried out by means of the apparatus schematically shown in the FIGURE.

The surface of an $Nb_3Sn$ layer about 10 micrometer thick, 12, which had been prepared on one side of a niobium plate 13 by diffusing tin at a temperature of about 1000° C was to be polished. The sides of the $Nb_3Sn$ surface 12 and were 20 mm × 100 mm long. Connected in parallel with the $Nb_3Sn$ surface 12 and arranged beside it was a sheet of niobium 1 with sides 25 mm × 100 mm. An aluminum sheet with sides 55 mm × 100 mm was used as the cathode 4. It was arranged opposite the $Nb_3Sn$ surface 12 and the niobium sheet 1 at a distance of 3 cm. The electrolyte consisted of 90% by volume of 96—% sulfuric acid and 10% by volume of 40—% hydroflouric acid. This corresponds to a composition of about 89.9% by weight $H_2SO_4$, 2.6% be weight HF and 7.6% by weight $H_2O$. The bath temperature was 25° C. The volume of electrolyte was 6 l and was circulated by the pump 10 with a velocity of 1 l/min during the phases when the voltage was switched off. Using the power supply 7, a d-c voltage of 12.8 V was first applied between the $Nb_3Sn$ surface 12 and the niobium sheet 1 on the one hand and the aluminum cathode 4 on the other hand. It was initially kept constant (±0.05 V). Immediately after this voltage was applied, damped current oscillations, which were superimposed on the electrolyte current, occurred. These were recorded for monitoring by means of the chart recorder 8.

The amplitude of these current oscillations rapidly increases to a maximum after a buildup process, and then slowly becomes smaller. The average current was about 10A in the present example and the maximum amplitude of the oscillations superimposed on the current, about 2 A. About 20 oscillations per minute occurred. When after about 4 minutes the current oscillations had decayed, the voltage was switched off in order to permit the dissolution of the oxide layer which had been formed on the $Nb_3Sn$ surface 12 as well as on the niobium sheet 1 during the oscillations. At the same time, the electrolyte was circulated for rinsing. After about 3 minutes, the voltage of 12.8 V was switched on once more. This again resulted in the above-described current oscillations. After 4 minutes, the voltage was again switched off for 3 minutes and then the sequence of states with the voltage switched on and off was repeated another four times. After this total of six polishing periods, i.e., six states with the voltage switched on, which were always followed by a state with the voltage switched off, a layer about 5 micrometers thick had been removed from the $Nb_3Sn$ surface 12. Pictures taken with a scanning electron microscope showed that the numerous peaks, depressions and corners, which were initially present on the $Nb_3Sn$ surface due to the crystalline structure of the $Nb_3Sn$, were very much rounded off after the six polishing steps and the surface was completely smooth, except for a slight hill structure. In the hill structure the distances of the hill peaks from each other were between about 1 micrometer and 5 micrometers. The height difference between the peak of the hill and the bottom an adjacent valley was less than 0.1 micrometer, as far as could be estimated from the scanning electron microscope pictures.

As in the method for the anodic polishing of niobium taught in U.S. Pat. No. 3,689,388, the current oscillations during the phases with the voltage switched on come about because resistance layers are built up and are broken down at the surface of the niobium part 1 by oxidation and deoxidation processes. The oxidation slightly predominates overall causing the damping and the eventual decay of the oscillations. If an $Nb_3Sn$ surface or the surface of one the above-mentioned niobium compounds or niobium alloys is used alone as the anode, then no current oscillations occur. Evidently, due to the different composition of the surface, resistance layers which are built up and removed and which are suited for the generation of such oscillations are not obtained at these surfaces. If, however, a niobium surface is connected in parallel with the $Nb_3Sn$ surface or one of the other surfaces mentioned in accordance with the present invention, then the current oscillations controlled by the chemical process at the niobium surface are also impressed on the current between the $Nb_3Sn$ surface, or the other surfaces, and the cathode. Thereby, oxidation and deoxidation processes evidently also occur alternatingly at the $Nb_3Sn$ surface or the other surfaces during the states with the voltage switched on. This leads to an excellent polishing effect and results in a particularly rapid flattening out of peaks and corners.

In addition to its application in the superconductor technology mentioned at the outset, the method according to the present invention can be employed to advantage anywhere that surfaces of intermetallic niobium compounds or of niobium alloys of very great smoothness are required.

What is claimed:

1. A method for the anodic polishing of surfaces of intermetallic niobium compounds and niobium alloys comprising:
    a. placing a niobium part as an anode and a cathode, in an electrolyte consisting of 86 to 93% by weight $H_2SO_4$, 1.5 to 4% by weight HF and 5.5 to 10.0% by weight $H_2O$ with a temperature of between 15° and 50° C;
    b. electrically shunting the surface to be polished across the niobium part;
    c. adjusting a constant voltage of between 9 and 15 V between the niobium part and the cathode in such a manner that damped current oscillations are superimposed on the electrolyte current;
    d. switching off the voltage at the latest after the current oscillations have decayed completely, and keeping it off until the oxide layer built up during the current oscillations is dissolved;
    e. subsequently again adjusting a constant voltage between 9 and 15 V so that damped current oscillations occur; and,
    f. repeating the sequence of states with the voltage switched on and off several more times.

2. The method according to claim 1, wherein said niobium part has a surface area facing the cathode which is at least as large as the surface area of the surface to be polished.

3. The method according to claim 2 wherein said surface to be polished is an $Nb_3Sn$ surface.

4. The method according to claim 1 wherein said surface to be polished is an $Nb_3Sn$ surface.

* * * * *